United States Patent [19]

Burkhalter et al.

[11] Patent Number: 4,465,416
[45] Date of Patent: Aug. 14, 1984

[54] WAFER HANDLING MECHANISM

[75] Inventors: David W. Burkhalter; Maurits R. Kain, both of Redwood City, Calif.

[73] Assignee: The Perkin-Elmer Corporation, Norwalk, Conn.

[21] Appl. No.: 378,689

[22] Filed: May 17, 1982

[51] Int. Cl.³ .............................................. B25J 3/00
[52] U.S. Cl. .................................... 414/217; 198/339; 198/488; 198/653; 118/50; 118/719; 118/729
[58] Field of Search ................. 414/217; 118/50, 500, 118/719, 720; 198/631, 486, 339, 580, 488, 394, 653

[56] References Cited

U.S. PATENT DOCUMENTS

| | | | |
|---|---|---|---|
| 2,711,817 | 6/1955 | Hautau et al. | 198/486 X |
| 3,315,778 | 4/1967 | Kendall et al. | 198/580 X |
| 3,521,765 | 7/1970 | Kauffman et al. | 414/222 X |
| 3,865,254 | 2/1975 | Johannsmeier | 198/394 X |
| 3,968,885 | 7/1976 | Hassan et al. | 414/217 X |

Primary Examiner—Joseph E. Valenza
Assistant Examiner—Stuart Millman
Attorney, Agent, or Firm—F. L. Masselle; T. P. Murphy; J. R. Dwyer

[57] ABSTRACT

Disclosed is a wafer handling device for a sputtering system where wafers, used in the manufacture of integrated circuits, are placed in a loading chamber, removed from the loading chamber and conveyed by a conveying device through a transportation chamber where they are individually picked from the conveying device by the wafer handling device and placed on a rotating table within the system sputtering chamber to be sputter processed. Concurrently within the placing of one unprocessed wafer on the rotating table, a processed wafer is picked from the rotating table and placed on a second conveying device or the same conveying device which brought unprocessed wafers to the wafer handling device for return to the loading chamber to be removed from the sputtering system for further handling and processing. While some edge contact of the wafer may sometimes occur when the wafer is off center of the claws of the wafer handling device, it is the bottom surfaces of the processed and unprocessed wafers which are the principal points of contact by the conveying device(s) and wafer handling device to avoid damage of the top surface of the wafer.

6 Claims, 6 Drawing Figures

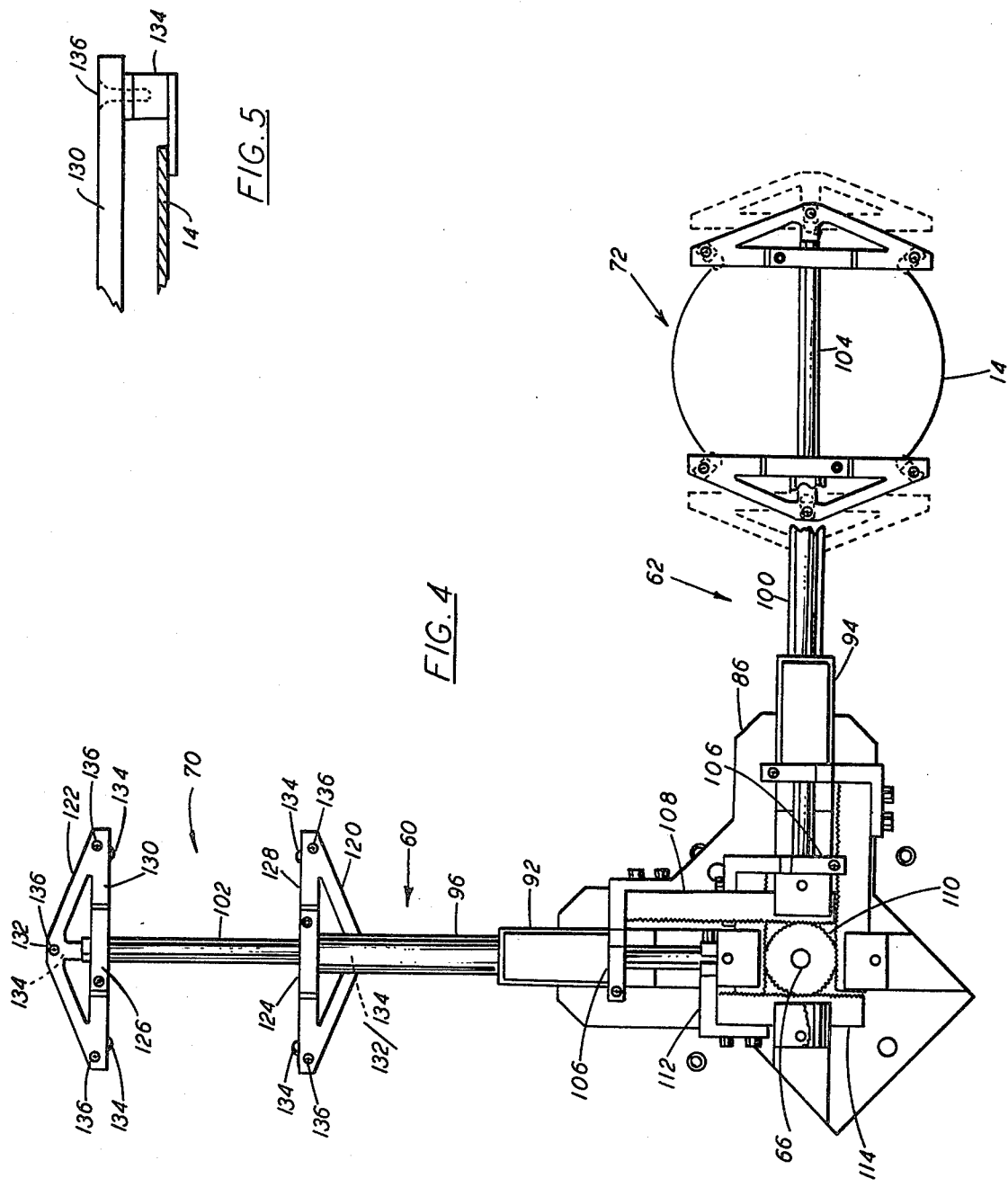

WAFER HANDLING MECHANISM

This invention relates to a new and improved wafer mechanism for handling wafers in a high vacuum DC and RF sputtering system.

High vacuum sputtering systems for the deposition and/or etching of material on wafers used in the manufacture of integrated circuits are well known. Such systems comprise a first airlock loading chamber in which a plurality of wafers to be processed are placed and from which the wafers are transported either on a pallet or on a conveyor through a second vacuum chamber or transportation chamber and are then placed on a rotating table or stage within the sputtering chamber. In this latter chamber, the wafers to be processed are rotated in the presence of DC or RF voltage, for the deposition of, or etching of, material on the wafer. After this sputter processing, the processed wafers are again transported back through the transportation chamber via the pallet or conveyor and into the loading chamber and removed for further handling/processing.

As is apparent to those skilled in the art, in operating such a sputtering system, it is critical that the wafers be handled in such a way that the surfaces of the wafer to be processed are not disturbed or otherwise damaged as they are being moved to and from the loading chamber and to and from the rotating table in the sputtering chamber. The usual conveyors and air type wafer transport mechanism alone do not suffice to make the transfer to or from a rotating table such as in a sputtering chamber.

Also, it will be apparent to those skilled in the art, a problem surmounted by this invention is the handling of wafers to and from a processing chamber by a wafer handling device which will operate in a high vacuum environment.

SUMMARY OF THE INVENTION

In a sputtering system which has a loading chamber, a transport chamber and a sputtering chamber all subjected to high vacuum for processing wafers in the sputtering chamber, a wafer handling system which includes (1) means for transporting wafers from the loading chamber to the entrance to the sputtering chamber and for returning processed wafers to the loading chamber, and (2) a wafer handling device capable of handling a wafer brought to the entrance to the sputtering chamber by a transporting means and placing it on a rotating table in the sputtering chamber for processing and at the same time handling a processed wafer located near the exit from the sputtering chamber and placing it on the transporting means for return to the loading chamber. The wafer handling system is such that the wafers are contacted mainly on the bottom surfaces at any time to avoid damage to the top surfaces of the wafers during the operation of the sputtering system. The operation of wafer handling device is timed to coincide with the arrival of wafers at the entrance to the sputtering chamber and the arrival of the processed wafers at the exit from the sputtering chamber for transporting to the loading chamber. Again, all of this wafer handling is done under vacuum.

Briefly stated another way, this invention includes a mechanism, a wafer handling device, for moving or handling wafers between a linearly system—pallet or conveyor—and a rotating system—rotating table—in a difficult environment, viz, high vacuum.

BRIEF DESCRIPTION OF THE DRAWINGS

FIG. 4 is a perspective view of a portion of the wafer handling device to illustrate its details more clearly, FIG. 5 is a partial elevational view of a portion of one of the claws of the wafer handling device.

DETAILED DESCRIPTION

Figure 1:
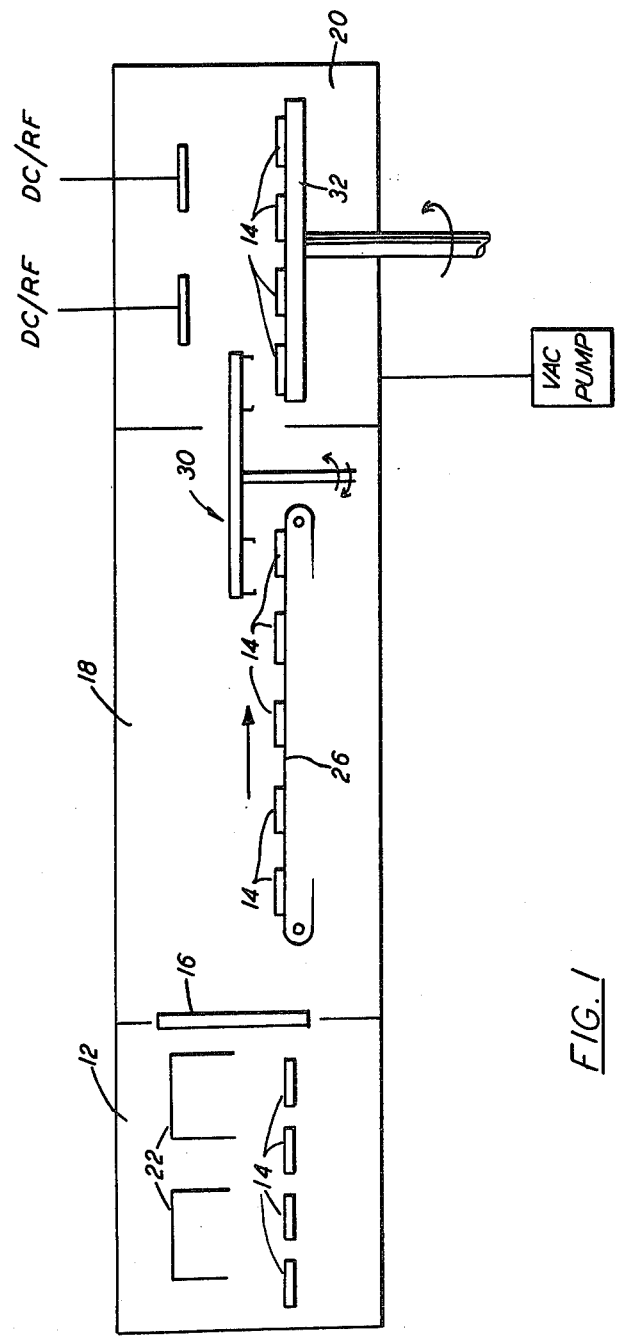
FIG. 1 is a simplified schematic illustration of a sputtering system in which this invention is incorporated.

FIG. 1 illustrates the sputtering system in which the present invention is employed. As can be seen in this Figure, in the system there is provided an input or loading chamber 12, shown only as a block diagram, in which a plurality of wafers 14 to be processed are placed. This chamber 12 is provided with an airlock 16 so that the wafers may be inserted into and withdrawn from this loading chamber without disturbing the high vacuum in the other chambers thus reducing the down time that would otherwise result due to pumping down the larger chambers. The other chambers, also shown as block diagrams, include a transportation chamber 18 and a sputtering chamber 20. Wafers are placed in the loading chamber, either on a pallet (not shown) or are in cassettes 22 and the cassettes are placed in this chamber and the wafers are removed from the chamber through the airlock to the transportation chamber 18. In the transportation chamber 18, the wafers are transported from the loading chamber 12 to the sputtering chamber 20 where the wafers are processed. As will be apparent from the more detailed description, the transportation chamber includes a suitable means to transport the wafers, such as the means for moving the pallet containing the unprocessed wafers toward the sputtering chamber, or a conveyor belt means 26, on which the unprocessed wafers are placed. In either case, the wafers are handled by a wafer handling device 30 when they arrive near the sputtering chamber which places the unprocessed wafers onto a rotating table 32 on which the wafers are processed within the sputtering chamber 20, and which removes the processed wafers from the rotating table 32 and places them either onto the pallet or onto a return belt which returns the wafers to the loading chamber 12 where they are removed from the system. In this disclosure of the invention, the conveyor belt will be described as one embodiment of the invention and in this Figure, only one belt moving the wafers in the direction of the sputtering chamber is shown for simplicity of disclosure. In either case, as mentioned above, it is important that the wafers be carefully handled as they are being placed on and removed from the rotating table and to and from the loading chamber and sputtering chamber. How this is accomplished will be apparent in the more detailed description hereinafter.

Figure 2:
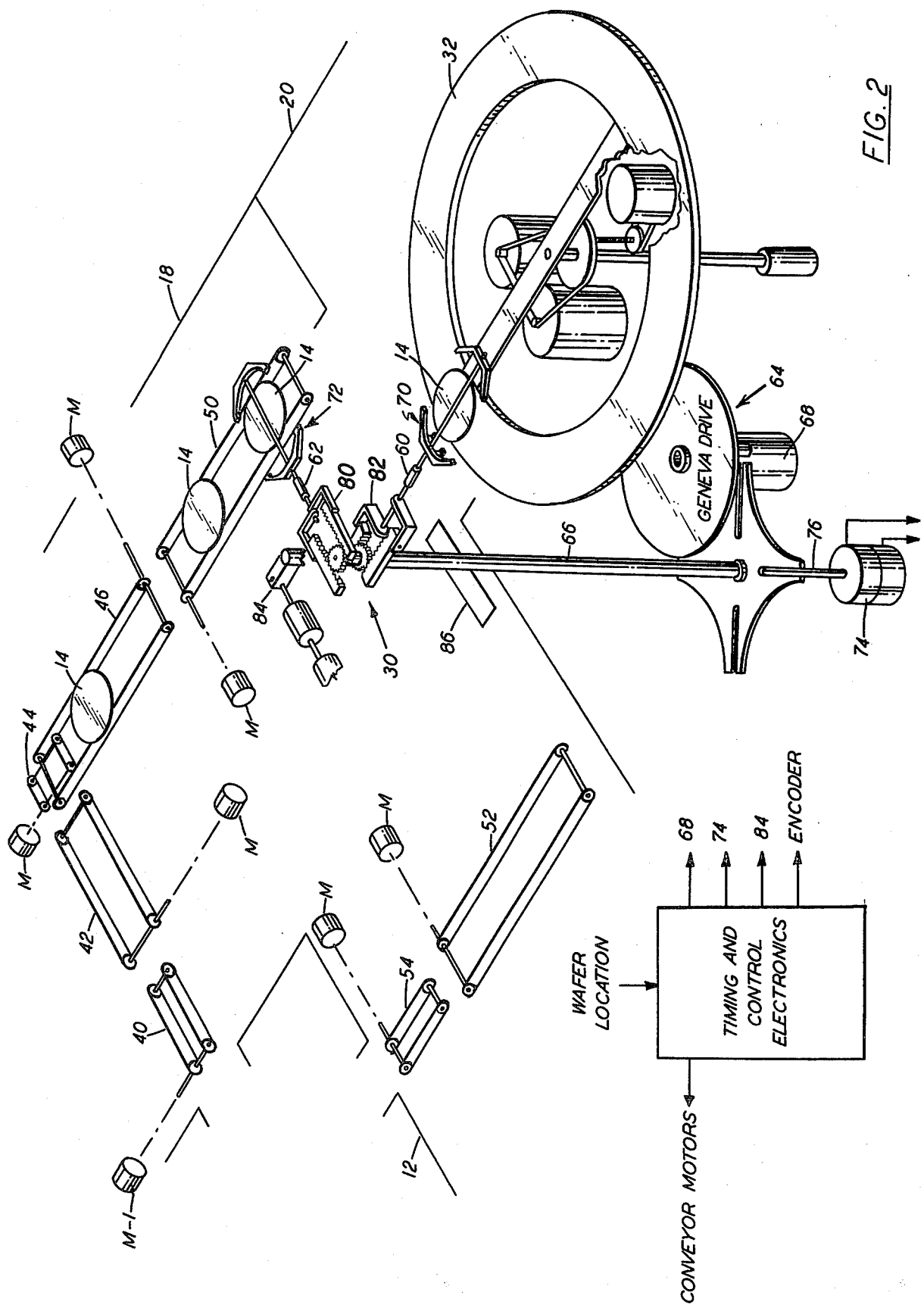
FIG. 2 is a simplified perspective view of one embodiment of this invention.

Attention is now directed to FIG. 2 which is a skeletonized perspective view of the apparatus for the sputtering system described above. The apparatus contained in each of the chambers is identified by lines identifying the chambers as 12, 18 and 20.

The wafer transportation means located in the transportation 20 and disclosed herein comprises a first motor driven unloader belt 40 (actually all belts consist of a pair of parallely disposed bands or rings of suitable, flexible, material) located at the exit of the loading chamber 12, a second motor driven larger belt 42 which cooperates with the first belt and moves the wafers in the same direction as belt 40 to a motor driven smaller corner belt 44, which aids the right angular transfer of the wafers to a pair of motor driven conveyor belts 46 and 50 for moving the wafers in a direction at a right angle to belts 40 and 42. The last conveyor belt 50 terminates adjacent an opening to the sputtering chamber. Finally, a return motor driven conveyor belt 52 also begins at the opening to the sputtering chamber 24 and terminates adjacent a loader conveyor belt 54 located adjacent the entrance to the loading chamber 12. Actually, the entrance and exit from the loading chamber 12 forms part of the airlock 20.

In order to properly handle and place the wafers which are in position to be loaded onto the rotating table 32 and to be removed from the rotating table, the wafer handling device 30, sometimes called a "pick-and-place" mechanism is provided. This device is capable of handling wafers moving in a linear motion (on the belts or pallet) onto a rotary motion device, rotating to table 32, and removes the wafers moving in a rotating motion (rotating table) onto a linear motion device, (either belt or pallet) and it accomplishes this in a high vacuum and without damaging the top surface of the wafers.

This device comprises two claw arms 60 and 62 located at right angles to one another rotated by a Geneva drive mechanism 64 through shaft 66 driven by motor 68. Each claw arm supports and actuates claws 70 and 72 located on the outer extremity thereof. The Geneva drive mechanism 64 positions this device so that one claw 70 is positioned to pick up a wafer from the conveyor belt 50, while the other claw 72 is positioned to pick up a wafer from the rotating table 32. The Geneva drive then rotates the two claw arms in unison to position the first claw 70 over the rotating table 32 and the second claw 72 over the return belt 52. In this position, the wafers are then released and thus accurately placed, one wafer for processing on the rotating table and one processed wafer for returning to the loading chamber. The two claws are the returned to their original position by the Geneva drive and the operation is repeated. The Geneva drive also will rotate the device 30 so that the arms are between the two rows of conveyor belts comprising belts 46, 50, 52 and 54, respectively, in a "stored" position outside the process chamber, when desired.

The two arms and jaws are raised during rotating movement and appropriately lowered and raised at the appropriate location to pick up the wafers and place the wafers as described by the motor and mechanism 74 which provide the up-down movement of shaft 76 within the hollow shaft 66.

The mechanism for opening and closing the claws is shown as a pair of rack and pinion gear systems 80 and 82, one for each arm driven by an air-driven actuator or pinion drive 84, all of which are raised and lowered by motor mechanism 74 and are rotated in unison by the Geneva mechanism 64. The rack and pinion gear system will now be described in connection with FIGS. 3 and 4.

Figure 3:
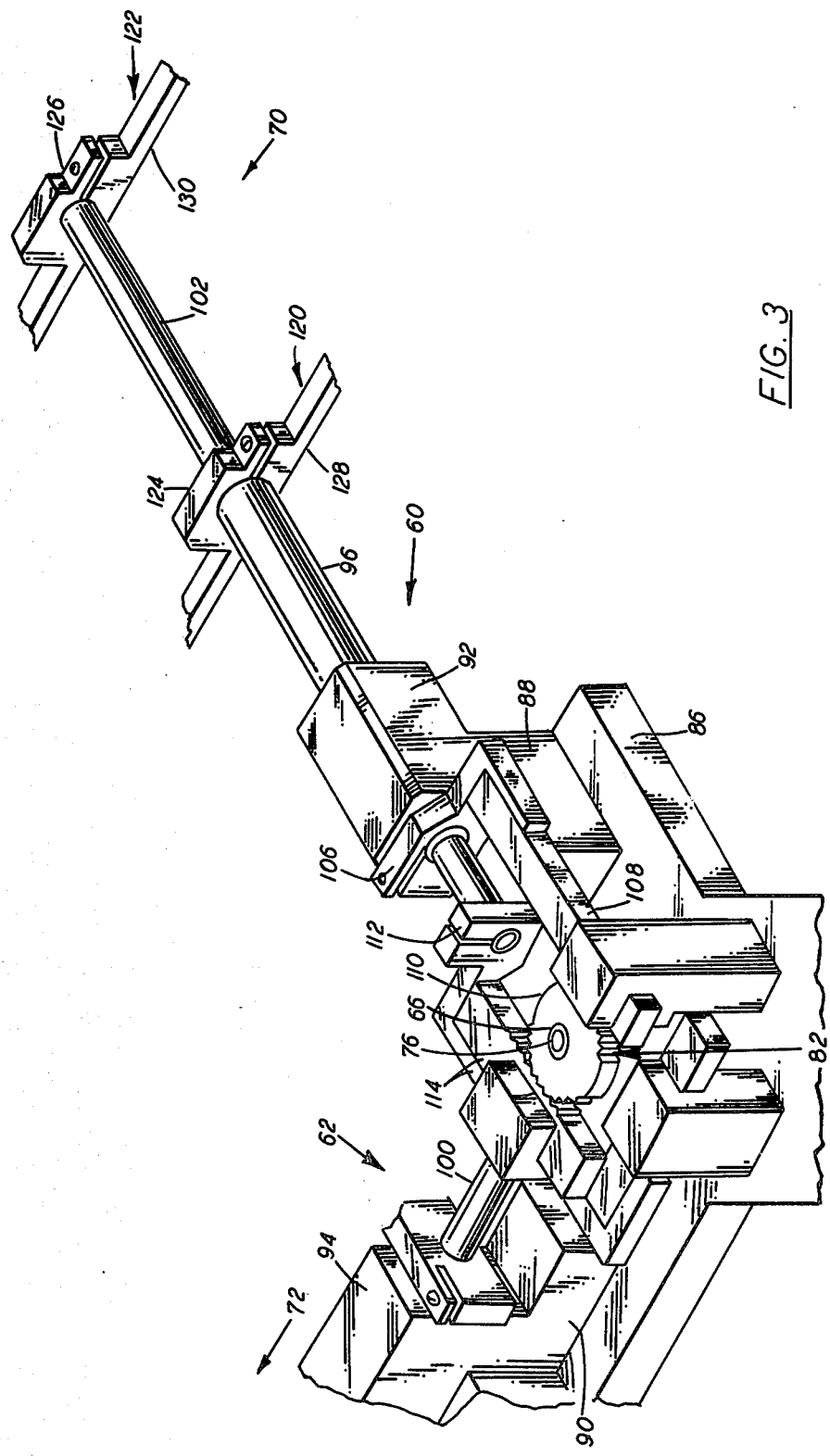
FIG. 3 is a plan view of the wafer handling device of this invention.

In FIGS. 3 and 4, the rack and pinion gear mechanisms for the pick-and-place mechanism 30 are shown positioned on a base plate 86 attached to the Geneva drive 64. The base plate has a pair of blocks 88 and 90, disposed at right angles to one another, and each having upward and outward extensions 92 and 94 which are axially bored to slidably receive, respectively, hollow sleeves or tubing 96 and 100, and tubing 102 and 104 slidable within the sleeves 96 and 100. (Since both claw arms 60 and 62 which comprises tubing 96–104 are identical, only one will be described hereinafter.)

Thus, the sleeve 96, being slidable with respect to the block 92, is clamped at one end by clamp 106 to a rack 108 cooperable with pinion gear 110 fixed to shaft 66 to move the rack back and forth in response to actuation of the shaft 66 by actuator 84. See FIG. 2. The tube 102, which is slidably within the sleeve 96, is also clamped at one end by clamp 112 to a second rack 114 which moves parallel, but in opposite direction, to the first rack 108, also in response to rotation of the pinion gear 110. Thus, the two tubes, moving in opposite directions, open and close claw 70, located on the claw arm 60.

The claw 70 comprises a pair of triangular shaped heads 120 and 122 attached by clamps 124 and 126 to sleeve 100 and tube 104, respectively. Clamps 124 and 126 are integral with transverse bars 128 and 130. Each end of bars 128 and 130 and the apex 132 of the triangular heads are provided with a claw hook 134, fixed to the heads by suitable means such as screws 136. These hooks are slightly canted so as to conform to the periphery of a wafer and designed to primarily engage the bottom of the wafer and lift the wafer off the conveyor belt and rotating table during the first operation and place the wafer on the rotating table and conveyor during the second operation without disturbing the wafer top surface. See FIG. 5. The only time the periphery of the wafer might be connected is when the wafer is slightly off center with respect to the center of the open claws.

Figure 6:
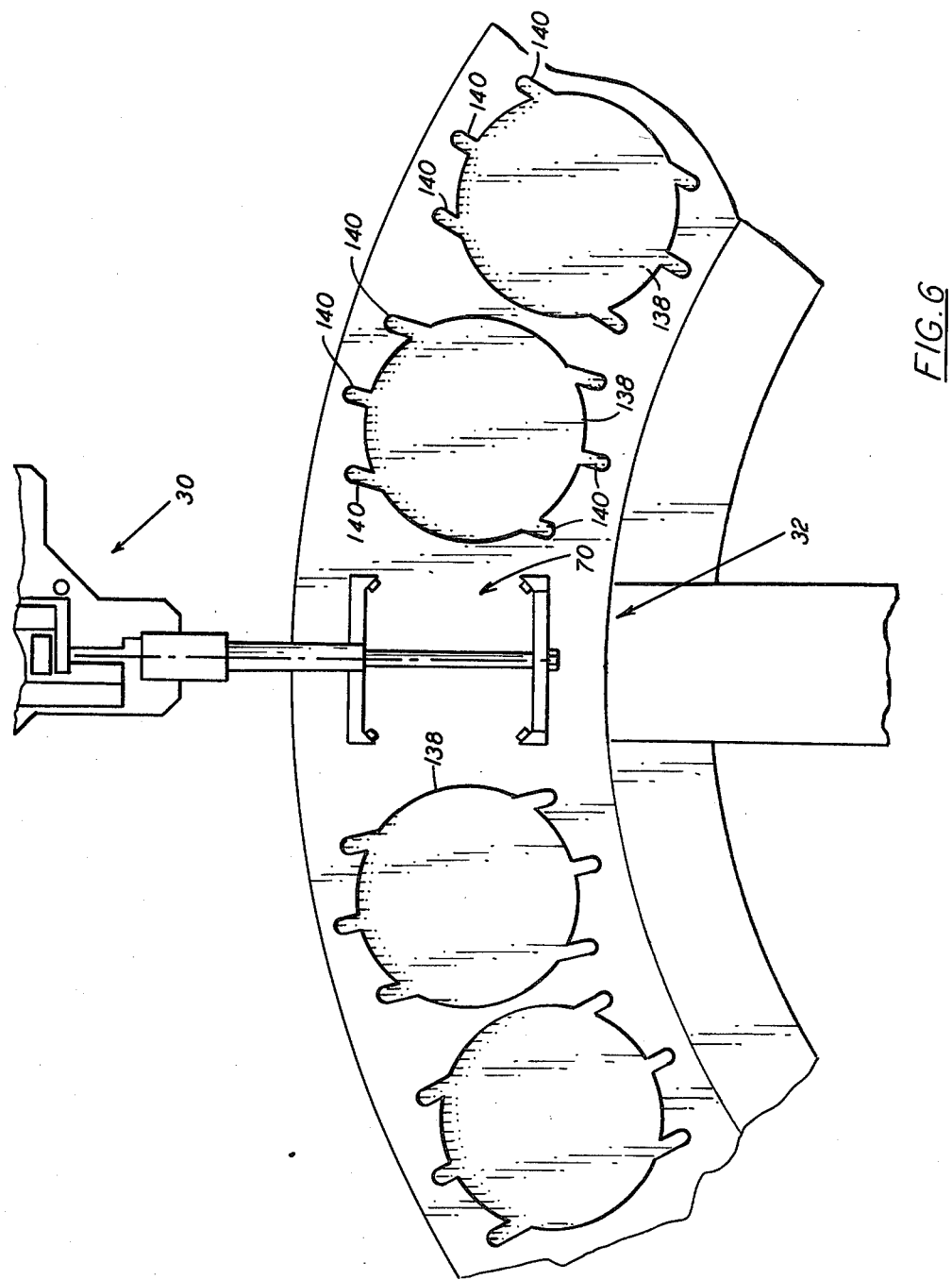
FIG. 6 is a view of a portion of the rotating table within the sputtering chamber.

In order for the claw hooks 134 to engage the wafers on the rotating table, the table is provided with slight cavities, one shown at 138 in FIG. 6 and with parallel grooves 140 located radial with respect to the table and radiating out from the cavities. There is one groove for each claw hook to enable the hooks to engage the bottom of the wafer while the latter is still on the table.

From the foregoing, it can be seen that there is disclosed a wafer transportation system including mechanism for moving wafers between one type of system and another, i.e., linear movement (conveyor belts) and rotational movement (rotating table) in high vacuum, without damaging the top or usable surface of the wafer at any time. Of course, suitable timing and wafer detecting mechanisms are necessary and are used so that the location of the wafers on the belts and table are constantly known and for timing the actuation of the Geneva mechanism 64, the motor 86 for raising and lowering the claw arms 60 and 62 and for actuation of the claws 70 and 72 by actuator 84. The means for detecting the location of the wafers for the timing mechanisms does not form a part of this invention. However, a preferred type of wafer detector is disclosed in a copending application of Donald L. Quick, application Ser. No. 379,402, filed May 18,1982, now U.S. Pat. No. 4,409,087. This detector is preferred in a system of this type where high vacuum and high RF power are used.

What is claimed is:

1. In a system for processing wafers to be used in the manufacture of integrated circuits, a wafer handling system comprising, a first chamber from which the wafers are removed for processing and where the wafers are returned after processing, transporting means in a second chamber for transporting wafers removed from said first chamber toward a third chamber for processing, and means in said second chamber for lifting said wafers from said transporting means and placing said wafers in said third chamber, said means in said second chamber also capable of lifting said wafers from said third chamber and placing said wafers onto said transportation means for return to said first chamber, said means for lifting said wafers from said transporting means comprises a wafer handling device including claw means capable of engaging a wafer only on one side, lifting said wafer by engaging said one side, transporting said wafer into said third chamber while in engagement with said one side, and releasing said wafer for processing in said third chamber, said third chamber having a rotating table and said wafer handling device being indexed to perform said engaging, lifting, transporting and releasing function in timed relationship with said rotating table.

2. The automatic wafer handling system as claimed in claim 1 wherein said wafer handling device is capable of engaging the said one side of said wafers in said third chamber while said wafers are on said table, lifting said engaged wafers from said table, transporting said wafers to said transporting means, and releasing said wafers for transportation by said transporting means to said first chamber.

3. The wafer handling system as claimed in claim 2 wherein said transporting means comprises a conveyor means extending from said first chamber to an opening in said third chamber.

4. The automatic wafer handling system as claimed in claim 3 wherein said transporting means comprises conveyor means extending from the exit of said third chamber to said first chamber.

5. In a system for processing wafers to be used in the manufacture of integrated circuits, a wafer handling system operable in a high vacuum, comprising, means for transporting wafers located in a first chamber through a second chamber to a processing chamber said processing chamber having a rotatable table on which wafers are placed, means for transporting wafers from said processing chamber through said second chamber to said first chamber, and means for simultaneously contacting the bottom of a first wafer located on the end of said first mentioned transporting means and the bottom of a second wafer on said table in said processing chamber lifting both wafers and then moving said first wafer to said processing chamber and said second wafer to said second mentioned transporting means lowering and releasing said first wafer on said table for processing and said second wafer for return to said first chamber.

6. In a system for processing wafers to be used in the manufacture of integrated circuits, a wafer handling system comprising, a loading chamber including an air lock where wafers are received from outside the system and returned to the outside, a vacuum chamber connected to the loading chamber, a processing chamber under vacuum having a rotatable table upon which wafers are placed for processing the top surfaces thereof, means for transporting wafers located in said loading chamber through said vacuum chamber to said processing while engaging only the bottom surfaces of said wafers, means for transporting wafers from said processing chamber through said vacuum chamber to said loading chamber while engaging only the bottom surfaces of said wafers, a pick-and-place mechanism in said vacuum chamber for lifting a first wafer located at the end of said first mentioned transporting means and simultaneously lifting a second wafer, if any, located on said rotating table and rotating and then lowering both said wafers so that said first wafer is placed on said rotating table and said second wafer is placed on said second mentioned transporting means, said pick-and-place mechanism including claw means which engage said wafers on the bottom surfaces leaving the top surfaces of the wafers free of possible damage or contamination by said mechanism, and indexing means and timing means for coordinating said pick-and-place mechanism with the rotation of said table and said transporting means so that this operation said pick-and-place mechanism including said claw means is timed to coincide with the arrival of a wafer at the end of said first mentioned transportation means and a wafer, if any, at the exit of said processing chamber.

* * * * *